United States Patent
Akamatsu

(10) Patent No.: US 11,687,289 B2
(45) Date of Patent: Jun. 27, 2023

(54) GENERATING MEMORY ARRAY CONTROL SIGNALS

(71) Applicant: Micron Technology, Inc., Boise, ID (US)

(72) Inventor: Hiroshi Akamatsu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/559,469

(22) Filed: Dec. 22, 2021

(65) Prior Publication Data

US 2022/0188036 A1 Jun. 16, 2022

Related U.S. Application Data

(63) Continuation of application No. 16/877,192, filed on May 18, 2020, now Pat. No. 11,210,029.

(51) Int. Cl.
*G06F 3/06* (2006.01)

(52) U.S. Cl.
CPC .......... *G06F 3/0659* (2013.01); *G06F 3/0604* (2013.01); *G06F 3/0683* (2013.01)

(58) Field of Classification Search
CPC ............... G06F 30/392; G06F 11/1666; G06F 12/0804; G06F 13/1694; G06F 13/385; G06F 16/22; G06F 17/142; G06F 17/15; G06F 1/24; G06F 2119/06; G06F 21/31; G06F 21/52; G06F 21/602; G06F 2203/04103; G06F 2213/0042; G06F 2213/3812; G06F 30/39; G06F 30/394; G06F 30/3953; G06F 3/0304; G06F 3/0412; G06F 3/04186; G06F 3/0446; G06F 3/0604; G06F 3/061; G06F 3/0635; G06F 3/0655; G06F 3/0658; G06F 3/0659;
(Continued)

(56) References Cited

U.S. PATENT DOCUMENTS

| 5,778,446 | A | 7/1998 | Kim |
| 2003/0067812 | A1 | 4/2003 | Kajimoto |
| 2008/0080297 | A1 | 4/2008 | Starnes |

FOREIGN PATENT DOCUMENTS

| CN | 101320593 A | 12/2008 |
| CN | 109147842 A | 1/2019 |

(Continued)

OTHER PUBLICATIONS

Chinese Patent Office, "Office Action and Search Report", issued in connection with Chinese Patent Application No. 202110517031.4 dated Apr. 7, 2022 (6 pages).

(Continued)

*Primary Examiner* — Yong J Choe
(74) *Attorney, Agent, or Firm* — Holland & Hart LLP

(57) ABSTRACT

Methods, systems, and devices for generating memory array control signals are described. A timing component may be configured to generate signals for operating a memory array. The timing component may include first logic that indicates when input signals are different, second logic that indicates when at least one of the input signals has a particular state, and third logic that indicates when the input signals have the same state. The output of the second logic and third logic may be controllable by other input signals. An output of the timing component may be set by one of the input signals and reset by the other input signals using the first logic, second logic, and third logic.

20 Claims, 8 Drawing Sheets

(58) Field of Classification Search
CPC ...... G06F 3/0679; G06F 3/0688; G06F 7/505; G06F 7/507; G06F 7/53; G06F 7/5443; G06F 7/57; G06F 7/582; G06F 9/30029; G06F 9/30101; G06F 9/30134; G06F 9/3806; G06F 9/4812
See application file for complete search history.

(56) References Cited

FOREIGN PATENT DOCUMENTS

| | | |
|---|---|---|
| CN | 109791783 A | 5/2019 |
| JP | 2001-028195 A | 1/2001 |

OTHER PUBLICATIONS

Chinese Patent Office, "Notice of Allowance and Search Report", issued in connection with Chinese Patent Application No. 202110517031.4 dated Aug. 24, 2022 (4 pages).

US 11,687,289 B2

GENERATING MEMORY ARRAY CONTROL SIGNALS

CROSS REFERENCE

The present application for patent is a continuation of U.S. patent application Ser. No. 16/877,192 by Akamatsu et al., entitled "GENERATING MEMORY ARRAY CONTROL SIGNALS," filed May 18, 2020, assigned to the assignee hereof, and is expressly incorporated by reference in its entirety herein.

BACKGROUND

The following relates generally to one or more systems for memory and more specifically to generating memory array control signals.

Memory devices are widely used to store information in various electronic devices such as computers, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component of the device may read, or sense, at least one stored state in the memory device. To store information, a component of the device may write, or program, the state in the memory device.

Various types of memory devices exist, including magnetic hard disks, random-access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source. FeRAM may be able to achieve densities similar to volatile memory but may have non-volatile properties due to the use of a ferroelectric capacitor as a storage device.

DETAILED DESCRIPTION

Figure 1:
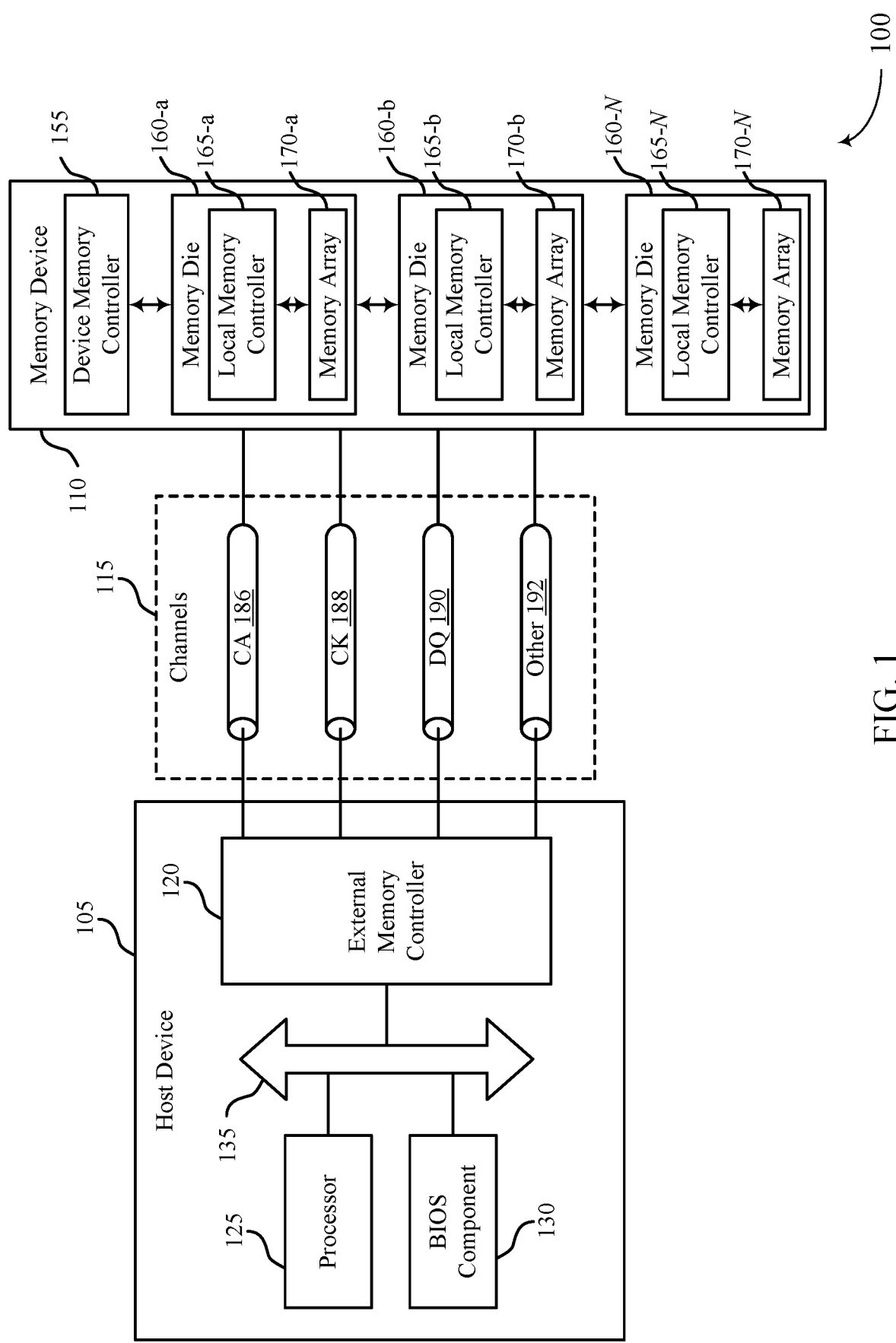
FIG. 1 illustrates an example of a system that supports generating memory array control signals in accordance with examples as disclosed herein.

Delay signals for executing a memory operation may be generated based on a reception of a memory command, and various control signals for internal operations associated with executing the memory operation may be timed or otherwise based on the delay signals. For example, a signal driver (which may be referred to as a set/reset signal driver) may use the delay signals to generate a control signal that transitions to an activated state when a first delay signal (a "set" signal) is received and returns to a deactivated state when a second delay signal (a "reset" signal) is received.

In some cases, to generate such a control signal, a set/reset driver may use a sequential (e.g., bistable) logic component, such as latch (e.g., a set/reset (SR) latch) that is operable by the set and reset signals. An output of a sequential logic component may be based on both present and past input signals. To support the operation of such a driver, the set/reset signal driver may include "one-shot pulse" circuits that generate set and reset pulses based on corresponding delay signals. But a set/reset signal driver that uses a sequential logic component may be vulnerable to malfunctions—e.g., if both a set and reset input of an SR latch are activated at the same time. Thus, an operation of such a set/reset signal driver may be carefully orchestrated and initialized before being used to prevent latch malfunctions and ensure that an internal SR latch functions in a predictable manner. Further, the generation of one-shot pulse signals for operating such a set/reset signal driver may introduce undesirable complexities or other drawbacks.

To avoid these or other drawbacks associated with some set/resent signal drivers, a set/reset signal driver may instead use combinational logic components (e.g., in lieu of sequential logic components) to generates a control signal based on set and reset signals. Combinational logic may differ from sequential logic—e.g., because combinational logic may produce outputs based on the present state of one or more input signals (e.g., exclusively), as opposed to being at least partially based on the prior state (e.g., historical sequence or timing) of one or more input signals. Thus, a set/reset signal driver that uses combinational logic components may operate in a predictable and reliable manner regardless of what combination of inputs are applied to the set/reset signal driver. Also, by using combinational logic components, one-shot pulse circuitry that generates voltage pulses or other complexities associated with operating a driver based on sequential logic may be avoided. These and other benefits discussed herein are merely exemplary, and one of ordinary skill in the art may appreciate other benefits of the teachings herein.

In some examples, a set/reset signal driver as described herein may include a first logic component, a second logic component, and a third logic component. Outputs of the first logic component may be coupled with inputs of the second logic component and an input of the third logic component. Outputs of the second logic component may be coupled with inputs of the third logic component. The first logic component may be configured to indicate when a first delay signal has a different state than a second delay signal. A second logic component may be configured to indicate when at least one of the first delay signal or the second delay signal has a particular state (e.g., a state that is represented by a high voltage) based on an output of the first logic component. And a third logic component may be configured to indicate when the first delay signal and the second delay signal have a same state based on an output of the first logic component and the second logic component. The signal generated by the third logic component may be used as, or to generate (e.g., by inversion), a control signal for one or more memory components used to execute a memory command that triggered the generation of the delay signals. In some cases, the output of the third logic may be set to a particular state (e.g., a state that is represented by a high voltage) using a control signal.

Features of the disclosure introduced above are further described below in the context of a memory system. Specific examples are then described of exemplary signal drivers and timing diagrams for generating memory array control signals. These and other features of the disclosure are further illustrated by and described with reference to apparatus diagrams, system diagrams, and flowcharts that relate to generating memory array control signals.

FIG. 1 illustrates an example of a system that supports generating memory array control signals in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device may be in coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or a system on a chip (SoC), among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may be operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, CA channels 186 may be operable to communicate commands between the host device 105 and the memory device 110 including control information associated with the commands (e.g., address information). For example, the CA channels 186 may carry an activate (ACT) command, read (RD) command, write (WR) command, or precharge (PRE) command. In some examples, the CA channels 186 may carry a RD command with an address of the desired data. In some examples, a CA channel 186 may include any number of signal paths to decode one or more of address or command data (e.g., eight or nine signal paths). A set of CA channels 186 may be referred to as a CA bus.

In some examples, data channels 190 may be operable to communicate one or more of data or control information between the host device 105 and the memory device 110. For example, the data channels 190 may communicate information (e.g., bi-directional) to be written to the memory device 110 or information read from the memory device 110.

In some examples, a memory die 160 may include one or more set/reset signal drivers (which may also be referred to as a timing component) that use combinational logic to generate control signals for operating a memory array 170 based on received delay signals. In some cases, the delay signals may themselves be generated based on (e.g., with configured delays relative to) commands received from a host device 105 (e.g., commands received via a CA bus). Each set/reset signal driver may include a first logic component, a second logic component, and a third logic component. Outputs of the first logic component may be coupled with inputs of the second logic component and an input of the third logic component. Outputs of the second logic component may be coupled with inputs of the third logic component. The first logic component may be configured to indicate when a first delay signal has a different state than a second delay signal. A second logic component may be configured to indicate when at least one of the first delay signal or the second delay signal has a particular state (e.g., a high state) based on an output of the first logic component. And a third logic component may be configured to indicate when the first delay signal and the second delay signal have a same state based on an output of the first logic component and the second logic component. The signal generated by the third logic component may be used as, or to generate (e.g., by inversion), a control signal for one or more memory components used to execute a memory command that triggered the generation of the delay signals. In some cases, the output of the third logic may be set to a particular state (e.g., a state that is represented by a high voltage) using a control signal.

Figure 2:
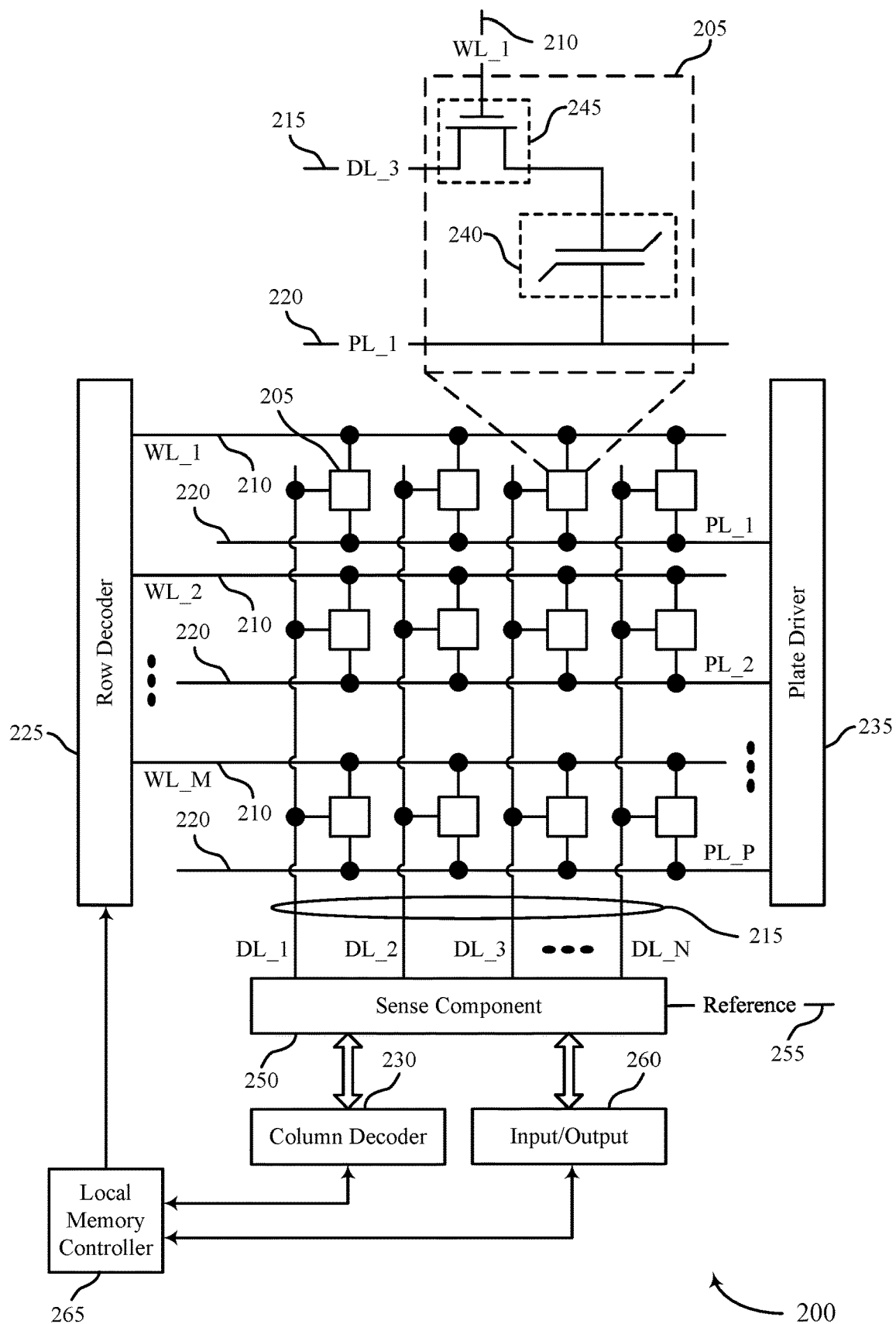
FIG. 2 illustrates an example of a memory die that supports generating memory array control signals in accordance with examples as disclosed herein.

FIG. 2 illustrates an example of a memory die that supports generating memory array control signals in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a state (e.g., polarization state or dielectric charge) representative of the programmable states in a capacitor. In FeRAM architectures, the memory cell 205 may include a capacitor 240 that includes a ferroelectric material to store a charge and/or a polarization representative of the programmable state. In DRAM architectures, the memory cell 205 may include a capacitor 240 that includes a dielectric material to store a charge representative of the programmable state. In phase change architectures, the memory cell 205 may include a phase change element that can be programmed to be in a programmable state, where a threshold voltage or resistance of the phase change element may be representative of a programmable state.

The memory cell 205 may include a logic storage component, such as capacitor 240, and a switching component 245. The capacitor 240 may be an example of a ferroelectric capacitor. A first node of the capacitor 240 may be coupled with the switching component 245 and a second node of the capacitor 240 may be coupled with a plate line 220. The switching component 245 may be an example of a transistor or any other type of switch device that selectively establishes or de-establishes electronic communication between two components.

The memory die 200 may include access lines (e.g., the word lines 210, the digit lines 215, and the plate lines 220) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, bit lines, or plate lines, or their analogues, are interchangeable without loss of understanding or operation. Memory cells 205 may be positioned at intersections of the word lines 210, the digit lines 215, and/or the plate lines 220.

Operations such as reading and writing may be performed on memory cells 205 by activating or selecting access lines such as a word line 210, a digit line 215, and/or a plate line 220. By biasing a word line 210, a digit line 215, and a plate line 220 (e.g., applying a voltage to the word line 210, digit line 215, or plate line 220), a single memory cell 205 may be accessed at their intersection. Activating or selecting a word line 210, a digit line 215, or a plate line 220 may include applying a voltage to the respective line.

Accessing the memory cells 205 may be controlled through a row decoder 225, a column decoder 230, and a plate driver 235. For example, a row decoder 225 may receive a row address from the local memory controller 265 and activate a word line 210 based on the received row address. A column decoder 230 receives a column address from the local memory controller 265 and activates a digit line 215 based on the received column address. A plate driver 235 may receive a plate address from the local memory controller 265 and activates a plate line 220 based on the received plate address.

Selecting or deselecting the memory cell 205 may be accomplished by activating or deactivating the switching component 245. The capacitor 240 may be in electronic communication with the digit line 215 using the switching component 245. For example, the capacitor 240 may be isolated from digit line 215 when the switching component 245 is deactivated, and the capacitor 240 may be coupled with digit line 215 when the switching component 245 is activated.

The sense component 250 may determine a state (e.g., a polarization state or a charge) stored on the capacitor 240 of the memory cell 205 and determine a logic state of the memory cell 205 based on the detected state. The sense component 250 may include one or more sense amplifiers to amplify the signal output of the memory cell 205. The sense component 250 may compare the signal received from the memory cell 205 across the digit line 215 to a reference 255 (e.g., a reference voltage). The detected logic state of the memory cell 205 may be provided as an output of the sense component 250 (e.g., to an input/output 260), and may indicate the detected logic state to another component of a memory device 110 that includes the memory die 200.

The local memory controller 265 may control the operation of memory cells 205 through the various components (e.g., row decoder 225, column decoder 230, plate driver 235, and sense component 250). The local memory controller 265 may be an example of the local memory controller 165 described with reference to FIG. 1. In some examples, one or more of the row decoder 225, column decoder 230, and plate driver 235, and sense component 250 may be co-located with the local memory controller 265. The local memory controller 265 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 265 may generate row signals and column address signals to activate the target word line 210, the target digit line 215, and the target plate line 220. The local memory controller 265 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 265 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 265 in response to various access commands (e.g., from a host device 105). The local memory controller 265 may be operable to perform other access operations not listed here or other operations related to the operating of the memory die 200 that are not directly related to accessing the memory cells 205.

A memory die 200 may support the generation of delay signals that are used to execute received memory commands (e.g., commands received over CA channels 186 as discussed with reference to FIG. 1, examples of which may include an ACT command, WR command, RD command, PRE command, etc.). Multiple delay signals may be generated relative to the reception of a memory command. Each delay signal may be delayed relative to a received memory command signal by a different duration—e.g., a first delay signal may be delayed by a first duration, a second delay signal may be delayed by a second duration, and so on. Once a respective duration elapses, a delay signal may transition from an initial state (which may be represented by a low voltage) to another state (which may be represented by a high voltage). The delay signal may remain in the other state until the memory operation is complete and/or until a different memory command is received. The delay signals may be used by other devices or components (e.g., set/reset signal drivers) to generate control signals that are used to cooperatively activate and deactivate components of a memory die 200, causing the memory die 200 to perform a requested operation. For example, combinations of the delay signals may be used to generate control signals that activate a first set of components that perform a first function during a first interval, a second set of components that perform a second function during a second interval, and so on.

The memory die 200 may include a delay circuit that generates the different delay signals. In some case, the delay circuit includes multiple delay components that are arranged in a chain or tree configuration, where the different delay signals may be obtained by observing (or accessing) different positions of the delay circuit. In an example for generating the different delay signals, a first delay component may receive a first memory command signal (or an indication that the first memory command was received). As a result, a voltage at an input of the first delay component may transition from a first voltage to a second voltage (e.g., from a low to a high voltage). Later, an output of the first delay component may transition from the first voltage to the second voltage after a delay period associated with the first delay component (e.g., 4 ns) has passed. Thus, a delay signal that is delayed relative to the memory command signal by a first duration (e.g., 4 ns) may be generated. An input of a second delay component may be coupled with the output of the first delay component. After the output of the first delay component transitions to the second voltage, an output of the second delay component may transition from the first voltage to the second voltage after another delay period associated with the second delay component (e.g., 1 ns) has passed. Thus, a delay signal that is delayed relative to the memory command signal by a second duration (e.g., 5 ns) may be generated. The output of the second delay component may be coupled with one or more other delay components, and this process may continue until an end of the delay circuit is reached.

The memory die 200 may include signal drivers that use the delay signals to generate control signals for executing a memory operation. The signal drivers may be, or include, set/reset signal drivers. An output of a set/reset signal driver may transition from one voltage to another voltage when a first signal (a set signal) is received and may transition from the other voltage to the initial voltage when a second signal (a reset signal) is received. For example, when a set signal that is provided to an input of the set/reset signal driver transitions to a high voltage, an output of the set/reset signal driver may transition to the high voltage. And when a reset signal that is provided to another input of the set/reset signal driver transitions to the high voltage, an output of the set/reset signal driver may transition to a low voltage. Thus, a set/reset signal driver may be configured to generate a control signal that is active for a particular duration by applying a first delay signal having a first delay to the set input of the set/reset signal driver and a second delay signal having a second delay to the reset input of the set/reset signal driver. In such cases, the control signal may be in an active state after the first delay period elapses and until the second delay period elapses—that is, the control signal may be active for a period between a rising edge of the first delay signal and a rising edge of the second delay signal. The control signal generated by a set/reset signal driver may be provided to a component or set of components included in memory die 200.

To generate a control signal that is activated by a set signal and deactivated by a reset signal, a set/reset signal driver may include sequential logic, such as a latch, and one or more one-shot pulse circuits (which may also be referred to as monostable multivibrators). An output of sequential logic may be based on both present and past inputs to the sequential logic. A latch may be a bistable device, and thus, may be able to hold a state (e.g., a set state or a reset state) indefinitely. One type of latch, an SR latch, may include a set input, a reset input, a set output, and a reset output. The reset output may be complementary to the set output, and thus may output an opposite logic state as the set output. A set output of the SR latch may transition to an activated state when an activation signal is applied to the set input and may remain in the activated state when the activation signal is removed from the set input. When the set output of the SR latch is in the activated state, the SR latch may be referred to as being in a set (or on) state. Later, the set output of the SR latch may transition to a deactivated state and the reset output may transition to an activated state when another activation signal is applied to the reset input. The set output may remain in the deactivated state after the activation signal is removed from the reset input. When the set output of the SR latch is in a deactivated state, the SR latch may be referred to as being in a reset (or off) state.

If activation signals are applied to both the set input and the reset input at the same time, both the set output and the reset output may have the same state (e.g., the deactivated state). Also, after the activation signals are removed (e.g., if they are removed simultaneously or if the reset signal is deactivated first), the SR latch may no longer function as expected—e.g., the SR latch may become stuck in the reset state. This failure of an SR latch may also be referred to as a metastable malfunction. Thus, when activation signals are concurrently applied to both the set and reset input, an SR latch may be referred to as being in an invalid state. For similar reasons, an operation of an SR latch at power up may be unpredictable, and thus, a deactivation signal may be applied to a reset input of an SR latch during power up to ensure the SR latch operates in a predictable manner.

To generate set and reset signal for the SR latch while avoiding an invalid state for the SR latch, a set/reset driver may use a first one-shot pulse circuit that is coupled with a set input of the SR latch and a second one-shot pulse circuit that is coupled with a reset input of the SR latch. A one-shot pulse circuit may be a monostable device, and thus, may be unable to hold one state (the unstable state) indefinitely. Thus, when an activation signal is applied to an input of a monostable device, an output of the monostable device may be configured to transition to an unstable state for a predetermined duration of time and then back to the stable state, regardless of whether the activation signal is maintained at the input. To reactivate the monostable device, the activation signal must first be removed from the input of the monostable device.

Accordingly, the one-shot pulse circuits may be used to generate set and reset voltage pulses based on the delay signals generated by the delay circuit, where the delay signals are configured to hold an activation state until a memory command is completed. That is, the first one-shot pulse circuit may be used to create a first voltage pulse when a first delay signal applied to the first one-shot pulse circuit transitions to an activation voltage and the second one-shot pulse circuit may be used to create a second voltage pulse when a second delay signal applied to the second one-shot pulse circuit transitions to the activation voltage. The first voltage pulse may be used to activate a set output of the SR latch. The second voltage pulse may be used to deactivate the set output of the SR latch. Without the one-shot pulse circuits, the delay signals may be unable to operate the SR latch—e.g., because a first and second delay signal may be held in an activated state throughout a memory operation. Accordingly, the set/reset driver may use an SR latch to generate a control signal that (1) transitions to an activation state when a first delay signal transitions to an activation state and (2) transitions back to a deactivation state when a second delay signal transitions to an activation state.

As described above, a memory die 200 may generate delay signals for executing a memory operation based on receiving a memory command. A set/reset signal driver included in the memory die 200 may use the delay signals to generate a control signal that transitions to an activated state when a first delay signal (or set signal) is received and returns to a deactivated state when a second delay signal (or reset signal) is received. To generate such a control signal, a set/reset driver may use an SR latch that is operable by the set and reset signals. To support the operation of the SR latch, the set/reset signal driver may include "one-shot pulse" circuits that generate set and reset pulses for operating the SR latch based on corresponding delay signals. But a set/reset signal driver that uses a sequential logic component, such as an SR latch, may be vulnerable to latch malfunctions—e.g., if both a set and reset input of the SR latch are activated at the same time. Thus, an operation of the set/reset signal driver may be carefully orchestrated and initialized before being used to prevent latch malfunctions and ensure that an internal SR latch functions in a predictable manner.

To avoid the risk of latch malfunctions, the memory die 200 may use set/reset signal drivers that replace sequential logic (e.g., an internal SR latch) with combinational logic that similarly generates a control signal based on set and reset signals. Combinational logic may differ from sequential logic (and an SR latch)—e.g., because combinational logic may produce outputs based on the present state of one or more input signals, as opposed to being at least partially based on the prior state (e.g., historical sequence or timing) of one or more input signals. Thus, combinational logic may operate in a predictable manner regardless of what combination of inputs are applied to the set/reset signal driver.

Also, by using combinational logic, one-shot pulse circuitry that generates voltage pulses for operating a sequential logic circuit (such as an SR latch) may be omitted from the set/reset signal driver.

In some examples, a set/reset signal driver (which may also be referred to as a timing component) include in a memory die 200 may include a first logic component, a second logic component, and a third logic component. Outputs of the first logic component may be coupled with inputs of the second logic component and an input of the third logic component. Outputs of the second logic component may be coupled with inputs of the third logic component. The first logic component may be configured to indicate when a first delay signal has a different state than a second delay signal. A second logic component may be configured to indicate when at least one of the first delay signal or the second delay signal has a particular state (e.g., a high state). And a third logic component may be configured to indicate when the first delay signal and the second delay signal have a same state based on an output of the first logic component and the second logic component. The signal generated by the third logic component may be used as, or to generate (e.g., by inversion), a control signal for one or more memory components used to execute a memory command that triggered the generation of the delay signals. In some cases, the output of the third logic may be set to a particular state (e.g., a high state) using a control signal.

Figure 3A:
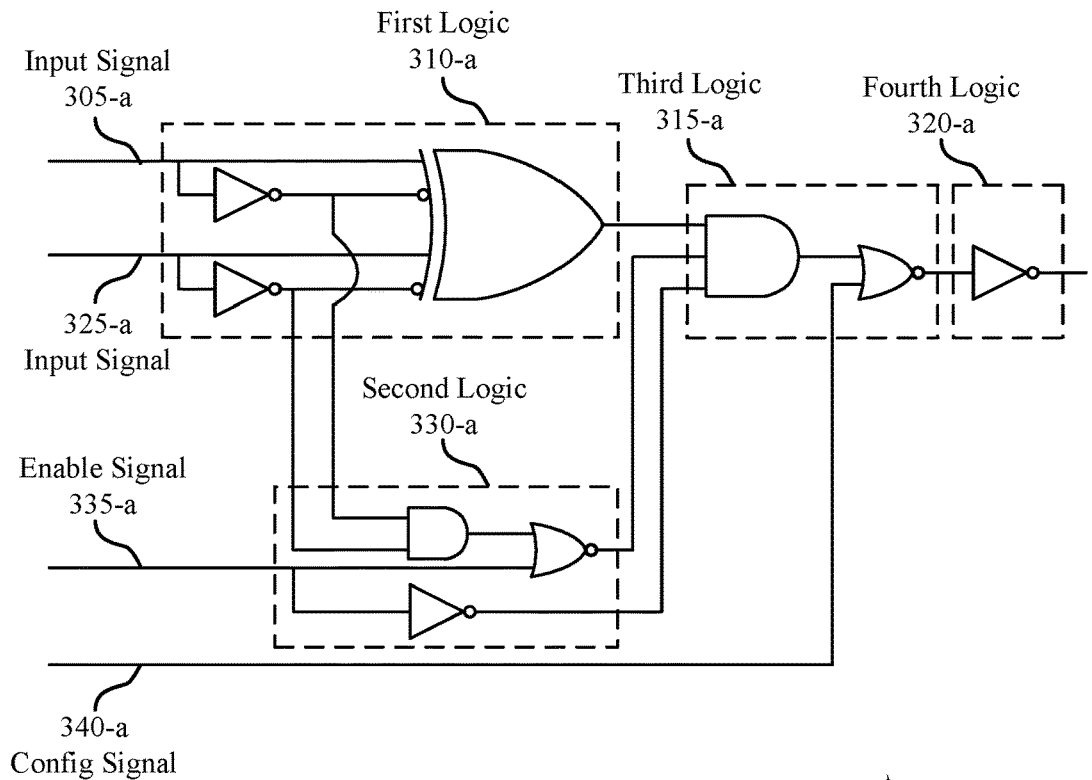
FIGS. 3A and 3B illustrate examples of signal drivers that support generating memory array control signals in accordance with examples as disclosed herein.

FIG. 3A illustrates an example of a signal driver that supports generating memory array control signals in accordance with examples as disclosed herein. First signal driver 300-*a* may be configured to generate control signals for executing a memory command.

As described herein, a set/reset driver (which may also be referred to as a timing component) may use combinational logic (e.g., in lieu of sequential logic). By omitting the use of sequential logic, one-shot pulse circuitry or other related complexities may be omitted, among other benefits.

First signal driver 300-*a* may be an example of a set/reset driver that that is configured to generate control signals for executing a memory command using combinational logic. The input of first signal driver 300-*a* may be referred to as a set input and the input of second signal driver 301-*b* may be referred to as the reset input. First signal driver 300-*a* may be configured to generate a control signal based on a collection of input signals, including first input signal 305-*a* (which may also be referred to as a SigSet signal), second input signal 325-*a* (which may also be referred to as a SigReset signal), enable signal 335-*a* (which may also be referred to as an EnF signal), and configuration signal 340-*a* (which may also be referred to as a ForceH signal). In some cases, first input signal 305-*a* may be, or be based on, a delay signal generated relative to a command signal. The control signal generated by first signal driver 300-*a* may be, or include, a positive voltage pulse. First signal driver 300-*a* may include first logic 310-*a*, second logic 330-*a*, third logic 315-*a*, and fourth logic 320-*a*.

First logic 310-*a* may be configured to detect when first input signal 305-*a* and second input signal 325-*a* have a different state—e.g., when first input signal 305-*a* has a first state (e.g., a high state associated with a high voltage) and second input signal 325-*a* has a second state (e.g., a low state associated with a low voltage), or vice versa. To detect when first input signal 305-*a* and second input signal 325-*a* have a different state, first logic 310-*a* may include logic that performs an exclusive OR (XOR) function with relation to first input signal 305-*a* and second input signal 325-*a*. For example, first logic 310-*a* may include an inverter that is configured to invert first input signal 305-*a*, another inverter that is configured to invert second input signal 325-*a*, and a four-input logic gate (e.g., a four-input XOR gate) that processes first input signal 305-*a*, second input signal 325-*a*, an inverted version of first input signal 305-*a*, and an inverted version of second input signal 325-*a*. The four-input logic gate may include a first non-inverting input that receives first input signal 305-*a*, a second inverting input (as signified by a bubble) that receives an inverted version of first input signal 305-*a*, a third non-inverting input that receives second input signal 325-*a*, and a fourth inverting input that receives an inverted version of second input signal 325-*a*. In some examples, the combination of the inverters and four-input logic gate reduce to a two-input XOR gate. Thus, an output of the four-input logic gate may be used to detect when first input signal 305-*a* and second input signal 325-*a* are different.

First logic 310-*a* may also be configured to output inverted versions of first input signal 305-*a* and second input signal 325-*a*—e.g., by making the outputs of the inverter that is configured to invert first input signal 305-*a* and the other inverter that is configured to invert second input signal 325-*a* available to other components of first signal driver 300-*a* (e.g., second logic 330-*a*).

Second logic 330-*a* may be configured to detect when at least one of first input signal 305-*a* and second input signal 325-*a* have a particular state—e.g., when either first input signal 305-*a* or second input signal 325-*a* has the first (e.g., high) state. To detect when one or both of first input signal 305-*a* and second input signal 325-*a* has the particular state, second logic 330-*a* may include logic that, in combination with first logic 310-*a*, performs an OR function with relation to first input signal 305-*a* and second input signal 325-*a*. For example, second logic 330-*a* may include a not AND (NAND) gate that is configured to determine when one or both of the inverted versions of first input signal 305-*a* and the inverted version of second input signal 325-*a* have the second (e.g., low) state.

Alternatively, second logic 330-*a* may be configured so that an output of second logic 330-*a* may be set to the second state using a control signal (e.g., enable signal 335-*a*). To enable second logic 330-*a* to be capable of both detecting when first input signal 305-*a* and second input signal 325-*a* have a particular state and being set to the second state, second logic 330-*a* may include an AND gate coupled with a not OR (NOR) gate (instead of the NAND gate). The NOR gate may be configured to invert an output of the AND gate when enable signal 335-*a* is in the second state, thus causing the AND gate and NOR gate to effectively form a NAND gate. And the NOR gate may be configured to output the second state when enable signal 335-*a* is in the first state, and thus, to cause second logic 330-*a* to output the second state.

Second logic 330-*a* may also include an inverter that is configured to invert an output of the enable signal. By including the inverter in second logic 330-*a*, second logic 330-*a* may generate, when the enable signal is in the first state, a second output that outputs the second state more quickly than if only the NOR gate were used to set the output of second logic 330-*a* to the second state.

Third logic 315-*a* may be configured to detect when first input signal 305-*a* and second input signal 325-*a* have a same state—e.g., when both first input signal 305-*a* and second input signal 325-*a* have the first (e.g., high) state, or when both first input signal 305-*a* and second input signal 325-*a* have the second (e.g., low) state. To detect when first input signal 305-*a* and second input signal 325-*a* have a same state, third logic 315-*a* may include logic that, in combination with first logic 310-*a* and second logic 330-*a*, performs an exclusive AND (XAND) function with relation to first input signal 305-*a* and second input signal 325-*a*. For example, third logic 315-*a* may include a three-input NAND gate that is configured to determine when a state of (1) an output of first logic 310-*a* that indicates when first input signal 305-*a* and second input signal 325-*a* are different; (2) an output of second logic 330-*a* that indicates when one or both of the inverted versions of first input signal 305-*a* and the inverted version of second input signal 325-*a* have the second state; and (3) an inverted version of enable signal 335-*a* are the same.

Alternatively, third logic 315-*a* may be configured so that an output of third logic 315-*a* may be set to the second state using a control signal (e.g., configuration signal 340-*a*). To enable third logic 315-*a* to be capable of both detecting when first input signal 305-*a* and second input signal 325-*a* have a same state and being set to the second state, second logic 330-*a* may include a three-input AND gate coupled with a NOR gate (instead of the three-input NAND gate). The NOR gate may be configured to invert an output of the three-input AND gate when configuration signal 340-*a* is in the second state, thus causing the three-input AND gate and NOR gate to effectively form a three-input NAND gate. And the NOR gate may be configured to output the second state when configuration signal 340-*a* is in the first state, and thus, to cause third logic 315-*a* to output the second state.

Fourth logic 320-*a* may be configured to invert an output of third logic 315-*a*. Thus, fourth logic 320-*a* may include logic that, in combination with first logic 310-*a*, second logic 330-*a*, and third logic 315-*a*, performs an XOR function with relation to first input signal 305-*a* and second input signal 325-*a* when enable signal 335-*a* and configuration signal 340-*a* have the second (e.g., low) state. Fourth logic 320-*a* may be configured to output the second state when enable signal 335-*a* has the first state and configuration signal 340-*a* has the second state. And fourth logic 320-*a* may be configured to output the first state when configuration signal 340-*a* has the first state.

In some cases, enable signal 335-*a* may be configured to override an output of first logic 310-*a* and set an output of first signal driver 300-*a* to the second state. Also, configuration signal 340-*a* may be configured to override an output of third logic 315-*a* and set an output of first signal driver 300-*a* to the first state—e.g., when a test mode is configured for a memory device that includes first signal driver 300-*a*.

Accordingly, an example truth table for first signal driver 300-*a* may be represented as:

TABLE 1

| Configuration Signal 340-a | Enable Signal 335-a | First Input signal 305-a | Second Input signal 325-a | Output Signal |
|---|---|---|---|---|
| 0 | 0 | 0 | 0 | 0 |
| 0 | 0 | 0 | 1 | 0 |
| 0 | 0 | 1 | 0 | 1 |
| 0 | 0 | 1 | 1 | 0 |
| 0 | 1 | X | X | 0 |
| 1 | X | X | X | 1 |

In some cases, the second row of Table 1 may be ignored—e.g., because enable signal 335-*a* may be used to override the logic combination for first input signal 305-*a* and second input signal 325-*a*.

Figure 3B:
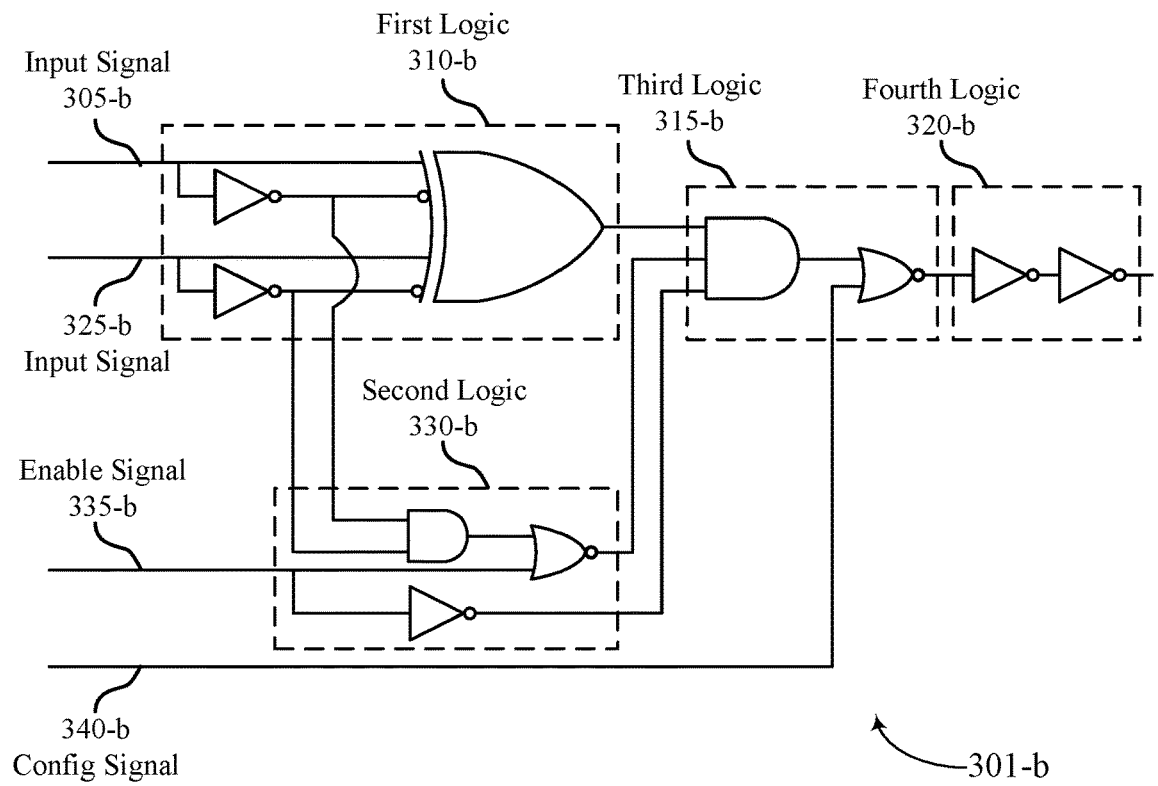

FIG. 3B illustrates an example of a signal driver that supports generating memory array control signals in accordance with examples as disclosed herein. Second signal driver 301-b may be configured to generate control signals for executing a memory command. Second signal driver 301-b may include first logic 310-b, second logic 330-b, third logic 315-b, and fourth logic 320-b, which may be examples of, or similarly configured as, first logic 310-a, second logic 330-a, third logic 315-a, and fourth logic 320-a. First input signal 305-b, second input signal 325-b, enable signal 335-b, and configuration signal 340-b may be examples, or similar to, first input signal 305-a, second input signal 325-a, enable signal 335-a, and configuration signal 340-a. First input signal 305-b, second input signal 325-b, enable signal 335-b, and configuration signal 340-b may be inputted into second signal driver 301-b.

Fourth logic 320-b of second signal driver 301-b may include two inverters, and thus, one additional inverter relative to fourth logic 320-a of FIG. 3A. Thus, when a same set of signals are applied to first signal driver 300-a of FIG. 3A and second signal driver 301-b, second signal driver 301-b may output a signal that is inverted relative to a signal outputted by first signal driver 300-a. For example, if first signal driver 300-a of FIG. 3A outputs a positive voltage pulse for an input signal combination, second signal driver 301-b may output a negative voltage pulse for the input signal combination. In some cases, instead of including an extra inverter in fourth logic 320-b, fourth logic 320-b may be omitted from second signal driver 301-b.

Accordingly, an example truth table for second signal driver 301-b may be represented as:

TABLE 2

| Configuration Signal 340-b | Enable Signal 335-b | First Input signal 305-b | Second Input signal 325-b | Output Signal |
|---|---|---|---|---|
| 0 | 0 | 0 | 0 | 1 |
| 0 | 0 | 0 | 1 | 1 |
| 0 | 0 | 1 | 0 | 0 |
| 0 | 0 | 1 | 1 | 1 |
| 0 | 1 | X | X | 1 |
| 1 | X | X | X | 0 |

In some cases, the second row of Table 2 may be ignored—e.g., because enable signal 335-b may be used to override the logic combination for first input signal 305-b and second input signal 325-b.

Figure 4:
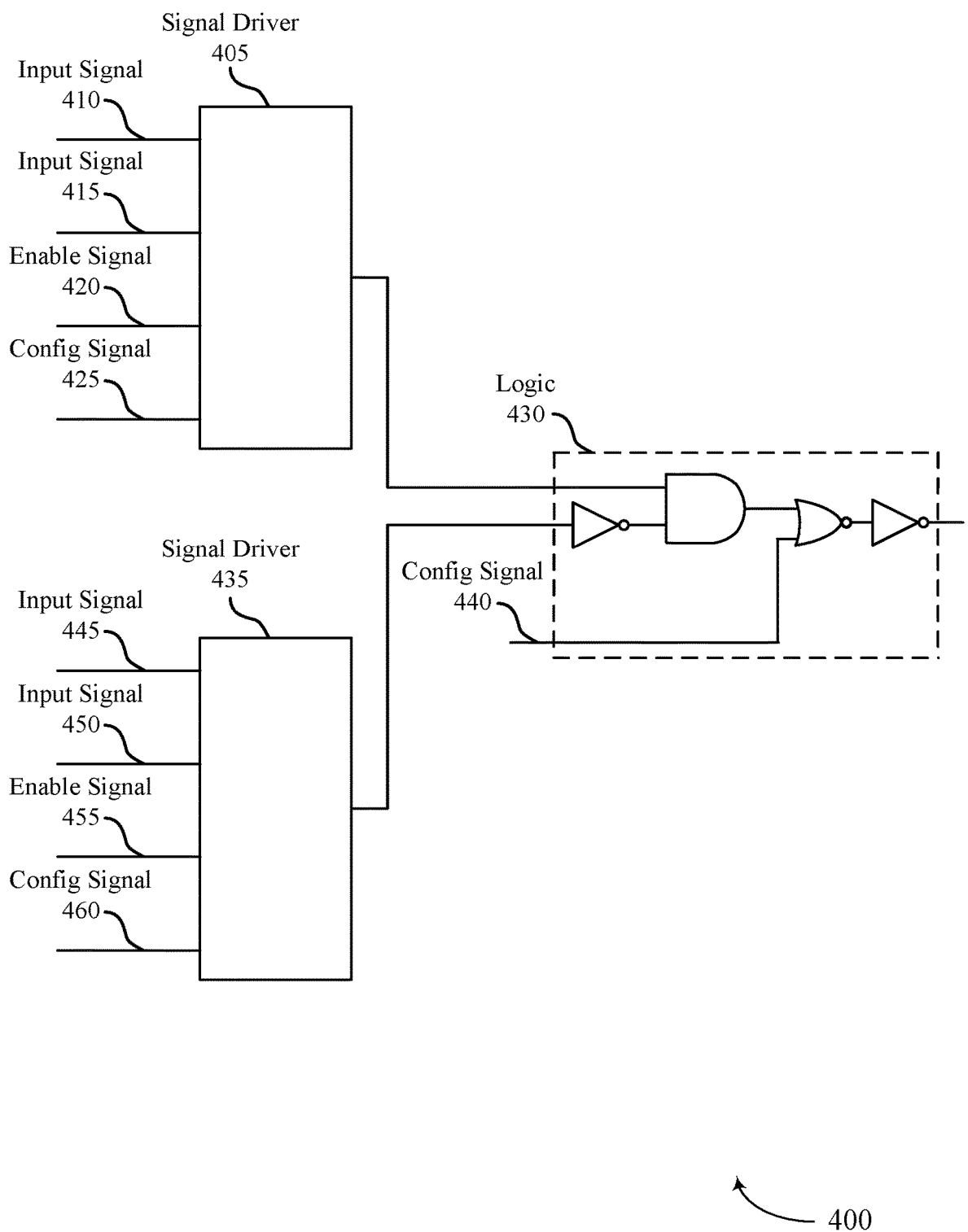
FIG. 4 illustrates an example of a composite signal driver that supports generating memory array control signals in accordance with examples as disclosed herein.

FIG. 4 illustrates an example of a composite signal driver that supports generating memory array control signals in accordance with examples as disclosed herein. Composite signal driver 400 may be configured to generate control signals for executing a memory command. Composite signal driver 400 may include multiple signal drivers, such as first signal driver 405 and second signal driver 435. First signal driver 405 and second signal driver 435 may be examples of first signal driver 300-a, as described with reference to FIG. 3A.

First input signal 410, second input signal 415, first enable signal 420, and first configuration signal 425 may be applied to first signal driver 405. Third input signal 445, fourth input signal 450, second enable signal 455, and second configuration signal may be applied to second signal driver 435. Third configuration signal 440 may be applied to logic 430. In some examples, first enable signal 420 and second enable signal 455 may be the same signal. In some examples, first configuration signal 425 may be the same signal as second configuration signal 460 and/or third configuration signal 440.

Composite signal driver 400 may include logic 430. Logic 430 may be configured to combine an output of first signal driver 405 and an output of second signal driver 435 to form a control signal that is based on both outputs (e.g., a signal having two voltage pulses). Logic 430 may also be configured to detect when an output of first signal driver 405 is in a high state and an output of second signal driver 435 is in a low state. To detect when the output of first signal driver 405 is in a high state and an output of second signal driver 435 is in the low state, logic 430 may include an inverter that is configured to invert an output of second signal driver 435, a NAND gate that is configured to detect when an output of first signal driver 405 and second signal driver 435 have a same state, and an inverter that is configured to invert an output of the NAND gate.

Alternatively, logic 430 may be configured so that an output of logic 430 may be set to the first state using a control signal (e.g., third configuration signal 440). To enable logic 430 to be capable of both detecting when the output of first signal driver 405 is in a high state and an output of second signal driver 435 is in a low state and being set to the first state, logic 430 may include an input AND gate that is coupled with a NOR gate (instead of the NAND gate). The NOR gate may be configured to invert an output of the AND gate when third configuration signal 440 is in the second state, thus causing the AND gate and NOR gate to effectively form a NAND gate. And the NOR gate may be configured to output the second state when third configuration signal 440 is in the first state, and thus, to cause logic 430 to output the first state.

In similar examples, a composite signal driver may include a signal driver that is an example of first signal driver 300-a and a signal driver that is an example of second signal driver 301-b. For example, first signal driver 405 may be an example of first signal driver 300-a and second signal driver 435 may be an example of second signal driver 301-b. In such cases, logic 430 may omit the first inverter that is coupled with the output of second signal driver 435—that is the output of second signal driver 435 may be directly coupled with the second input of the AND gate of logic 430.

Figure 5A:
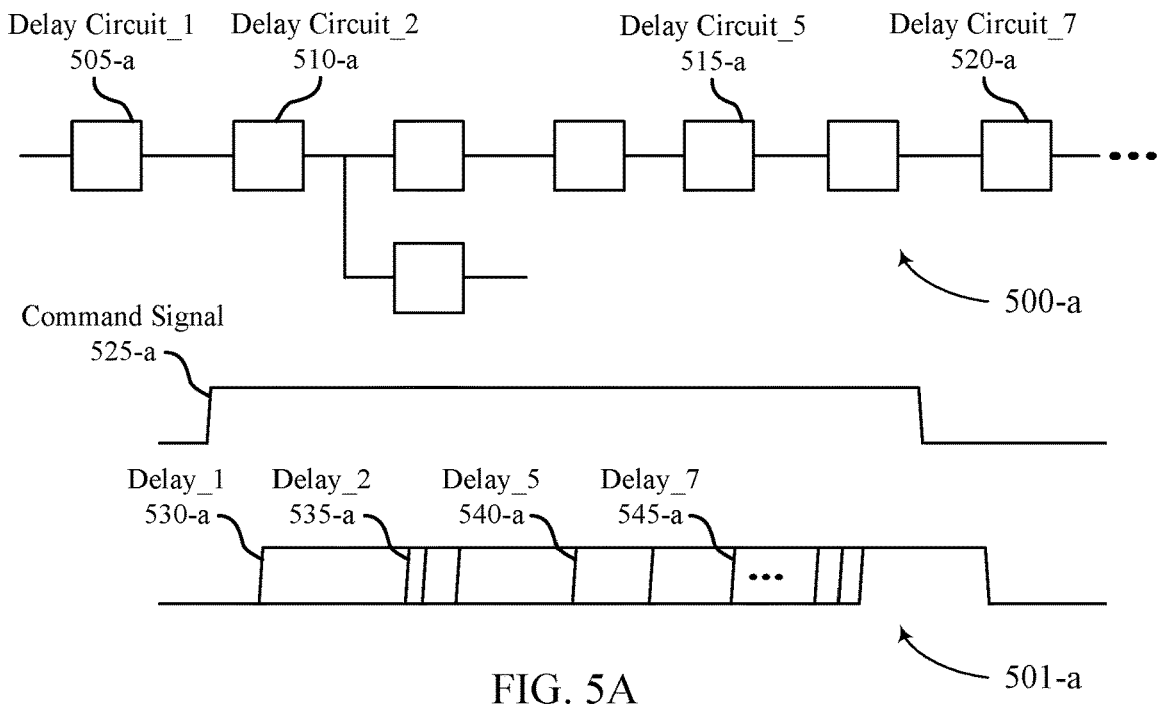
FIG. 5A illustrates an exemplary delay circuit and timing diagram that supports generating memory array control signals in accordance with examples as disclosed herein.

FIG. 5A illustrates an exemplary delay circuit and timing diagram that supports generating memory array control signals in accordance with examples as disclosed herein. Delay circuitry 500-a may be configured to generate multiple delay signals that are delayed relative to a received command signal. Delay circuitry 500-a may include multiple delay circuits, such as first delay circuit 505-a, second delay circuit 510-a, fifth delay circuit 515-a, and seventh delay circuit 520-a, that may be arranged in a chain or tree configuration.

As shown by timing diagram 501-a, command signal 525-a may transition to a first state (represented by a high voltage) when a command is received. Command signal 525-a may be used to indicate that a memory command (e.g., an ACT signal, WR signal, RD signal, PRE signal, etc.) was received at a memory device. Command signal 525-a may be applied to (e.g., received by) first delay circuit 505-a. First delay circuit 505-a may delay a propagation of command signal 525-a (e.g., signals based thereupon) through delay circuitry 500-a. Command signal 525-a (e.g., delay signals 530 based thereupon) may continue to propagate through delay circuitry 500-a until reaching an end of delay circuitry 500-a. For example, the command signal 525-a may be received at a first delay circuit 505-a, and the first delay circuit 505-a may generate and output a first delay signal 530-a that may change state with some delay relative to the command signal 525-a changing state; the first delay signal 530-*a* may be received at a second delay circuit 510-*a*, and the second delay circuit 510-*a* may generate and output a second delay signal 535-*a* that may change state with some delay relative to the first delay signal 530-*a* changing state; and so on. Additionally or alternatively, partially or wholly parallelized arranged of delay circuits may in some cases be used.

Timing diagram 501-*a* may depict the propagation of command signal 525-*a* through delay circuitry 500-*a*, where first delay signal 530-*a* may depict a voltage of an output of first delay circuit 505-*a*, second delay signal 535-*a* may depict a voltage of second delay circuit 510-*a*, fifth delay signal 540-*a* may depict a voltage of fifth delay circuit 515-*a*, and seventh delay signal 545-*a* may depict a voltage of seventh delay circuit 520-*a*. After transitioning to the high state, each of the delay signals may be held in the high state until a transitioning event occurs (e.g., the memory operation is completed or another memory command is received). The delay signals may be input directly into a signal driver (or timing component), and thus, may be equivalent to an input signal as described with reference to FIGS. 3A, 3B, and 4. Alternatively, one or more of the delay signals may be processed to produce an input signal for a signal driver (or timing component).

Timing diagram also depicts the propagation of command signal 525-*a* through additional delay circuits (both depicted and not) in delay circuitry 500-*a*. Different combinations of the delay signals depicted in timing diagram 501-*a* may be provided to a signal driver, such as first signal driver 300-*a*, second signal driver 301-*b*, or composite signal driver 400, as described with reference to FIGS. 3A, 3B, and 4.

Command signal 525-*a* may transition to a second state (represented by a low voltage) when a memory operation triggered by the memory command is completed or another memory command is received. After command signal 525-*a* transitions to the low state, each of the delay signals may transition to the low state after a duration. In some cases, each of the delay signals simultaneously transitions to the low state. In other cases, the delay signals concurrently transition to the low state, but the transitions are offset from one another.

Figure 5B:
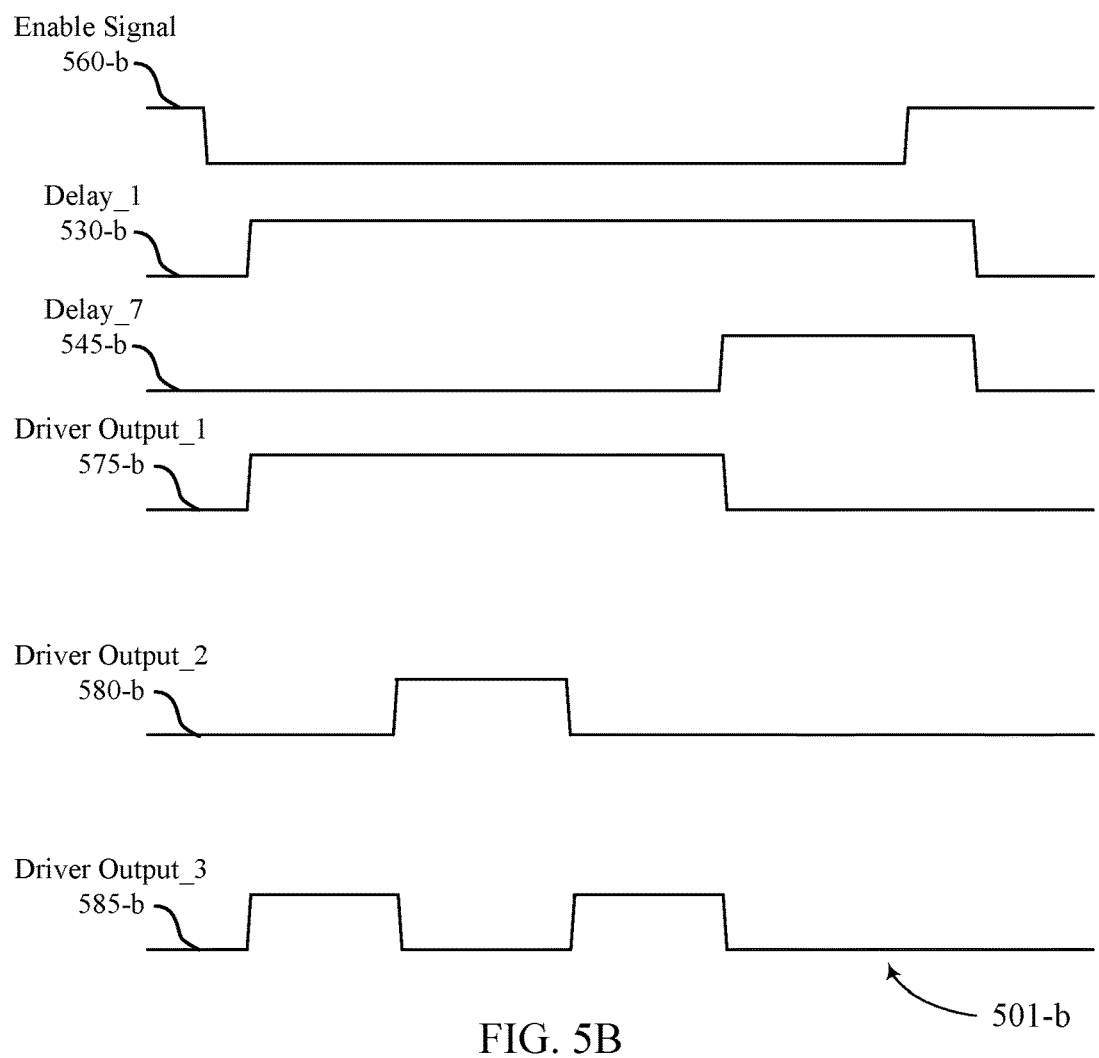
FIG. 5B illustrates an exemplary timing diagram that supports generating memory array control signals in accordance with examples as disclosed herein.

FIG. 5B illustrates an exemplary timing diagram that supports generating memory array control signals in accordance with examples as disclosed herein. Timing diagram 501-*b* may illustrate a combination of signals provided to and output by multiple signal drivers. Enable signal 560-*b*, first delay signal 530-*b*, and seventh delay signal 545-*b* may be inputted to a signal driver that is configured to generate a positive voltage pulse (e.g., first signal driver 300-*a* of FIG. 3A) and generates first driver output signal 575-*b*. First delay signal 530-*b* may correspond to first delay signal 530-*a* and seventh delay signal 545-*b* may correspond to seventh delay signal 545-*a*, as described with reference to FIG. 5A. In some cases, first delay signal 530-*b* may be referred to as a set signal (or SigSet) and may be applied to a set input of the signal driver, and seventh delay signal 545-*b* may be referred to as a reset signal (or SigReset) and applied to a reset input of the signal driver. Enable signal 560-*b* may be applied to an enable input of the signal driver.

In some examples, before command signal 525-*a* is received, enable signal 560-*b* may be in a first state (which may be represented by a high voltage) and first driver output signal 575-*b* may be in a second state (which may be represented by a low voltage). Thus, an output of a first logic circuit (e.g., first logic 310-*a* of FIG. 3A) may be overridden. After command signal 525-*a* is received, enable signal 560-*b* may be transitioned to the second state. Accordingly, an output of the first logic circuit in the signal driver may be enabled.

After enable signal 560-*b* transitions to the second state, first driver output signal 575-*b* may maintain the second state based on both first delay signal 530-*b* and seventh delay signal 545-*b* being in the second state. Next, enable signal 560-*b* transitions to the second state, first delay signal 530-*b* may transition to the first state. Thus, based on enable signal 560-*b* being in the second state, first delay signal 530-*b* being in the first state, and seventh delay signal 545-*b* being in the second state, first driver output signal 575-*b* may transition to the first state—e.g., based on the signal driver detecting that the first delay signal 530-*b* and the seventh delay signal 545-*b* have different states.

Later, seventh delay signal 545-*b* may transition to the first state, and thus, first driver output signal 575-*b* may transition to the second state—e.g., based on the signal driver detecting that the first delay signal 530-*b* and the seventh delay signal 545-*b* have the same states. Both first delay signal 530-*b* and seventh delay signal 545-*b* may be held in the first state until a second command is received and command signal 525-*a* transitions to the second state. Before or concurrently with the transition of command signal 525-*a* to the second state, enable signal 560-*b* may be returned to the high state, disabling the output of the first logic component. In some cases, enable signal 560-*b* may be returned to the high state after a last delay signal is generated by delay circuitry 500-*a*—e.g., based on the last delay signal. Thus, first driver output signal 575-*b* may be set to the second state regardless of any changes to first delay signal 530-*b* and seventh delay signal 545-*b*. By asserting enable signal 560-*b*, the signal driver may avoid signaling errors that may occur if first delay signal 530-*b* transitions to the second state before seventh delay signal 545-*b*, or vice versa.

Enable signal 560-*b*, or a different enable signal, may also be provided to a second signal driver that generates second driver output signal 580-*b*. Also, second delay signal 535-*a* and fifth delay signal 540-*a* may similarly be applied to a set and reset input of the second signal driver. Thus, the second signal driver may output a positive voltage pulse that is within the boundaries of the positive voltage pulse generated by the first signal driver. Additionally, an inverted version of first driver output signal 575-*b* and/or second driver output signal 580-*b* may be generated by applying first delay signal 530-*b* and seventh delay signal 545-*b* to a signal driver that is configured to generate a negative pulse (e.g., second signal driver 301-*b*).

As described herein, a composite signal driver may be used to combine an output of the first signal driver (first driver output signal 575-*b*) and the second signal driver (second driver output signal 580-*b*), as described with reference to FIG. 4, yielding another output signal (e.g., third driver output signal 585-*b*). Third driver output signal 585-*b* may be, o include, dual voltage pulses. When the outputs of first signal driver and the second signal driver are combined, the third driver output signal 585-*b* may transition to the first state when first driver output signal 575-*b* transitions to the first state, transition back to the second state when first driver output signal 575-*b* and second driver output signal 580-*b* are both in the first state, and again transition to the first state when first driver output signal 575-*b* is in the first state and second driver output signal 580-*b* transitions to the second state.

The driver output signals may be used to operate different components of a memory array so that a memory operation associated with a received memory command is executed by the memory array. For example, a driver output signal (e.g., first driver output signal 575-*b*) may be used to activate a word line that is used to select a memory cell. Another driver output signal (e.g., second driver output signal 580-*b*) may be used to trigger a sense component. Another driver output signal (e.g., third driver output signal 585-*b*) may be used to activate a memory component twice during a memory operation. Other driver output signals may be used to precharge digit lines, isolate and connect a sense component to a digit line, cause a voltage to be applied to a plate line that is coupled with a memory cell, and the like. In some cases, the control signals generated by the signal drivers, and the order in which the control signals are generated, is based on a received command. For example, a first set of signal drivers may output signals that cause memory cells in a memory array to be sensed when an ACT command is received.

Figure 6:
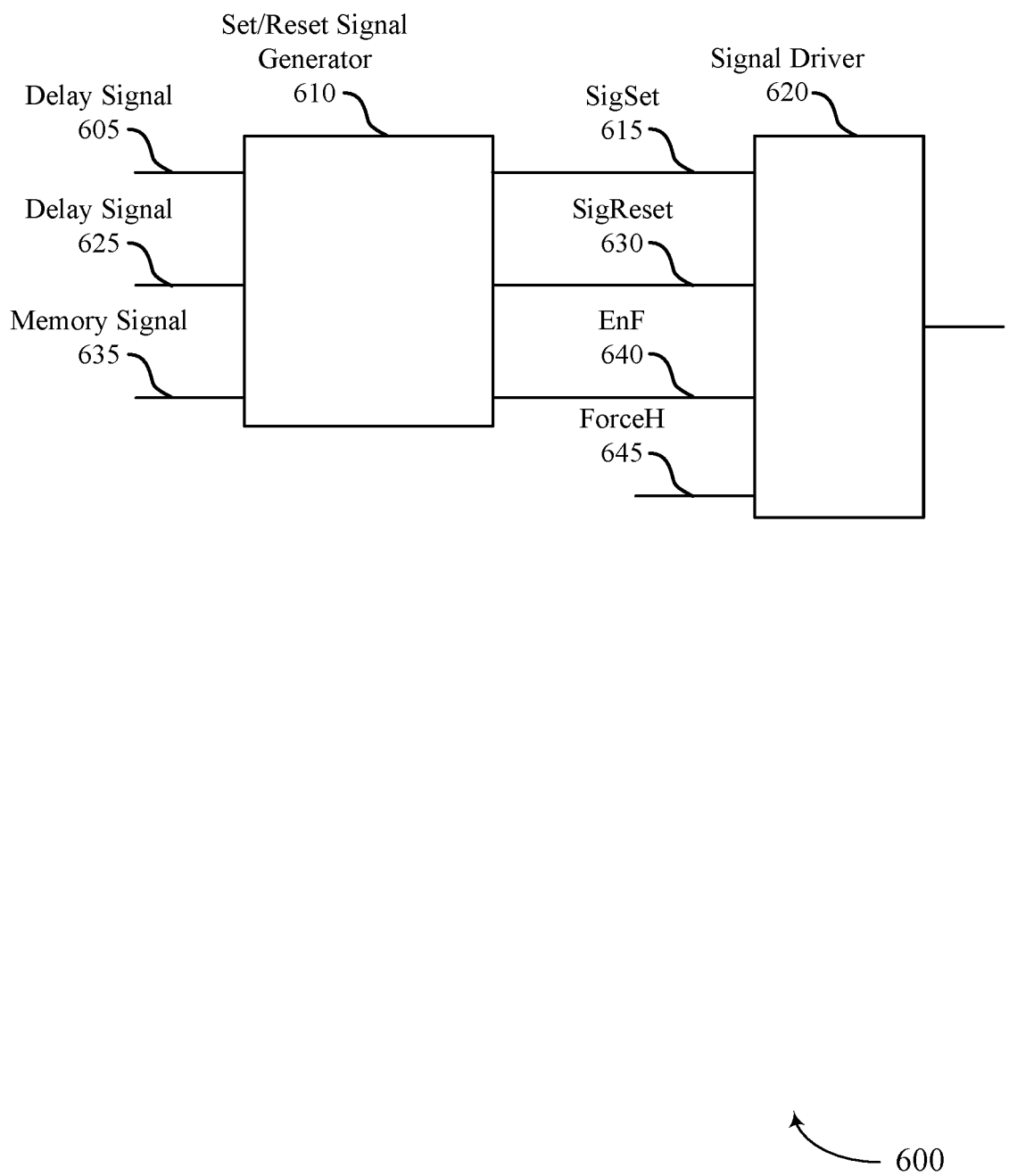
FIG. 6 illustrates an example of a control signal generation system that supports generating memory array control signals in accordance with examples as disclosed herein.

FIG. 6 illustrates an example of a control signal generation system that supports generating memory array control signals in accordance with examples as disclosed herein. Control signal generation system 600 may be configured to generate a control signal that causes a memory array to perform one or more functions for executing a memory operation. Control signal generation system 600 may include a set/reset signal generator 610 and a signal driver 620. Signal driver 620 may be an example of first signal driver 300-*a* or second signal driver 301-*b*, as described with reference to FIGS. 3A and 3B.

Set/reset signal generator 610 may be configured to generate a set signal (SigSet 615, which may be an example of an input signal as described with reference to FIGS. 3A, 3B, and 4) and reset signal (SigReset 630, which may be an example of an input signal as described with reference to FIGS. 3A, 3B, and 4) for signal driver 620 using first delay signal 605 and second delay signal 625. First delay signal 605 may be an example of a delay signal as described herein and with reference to FIG. 5. For example, first delay signal 605 may be an example of first delay signal 530-*a* of FIG. 5A, and second delay signal 625 may be an example of seventh delay signal 545-*a* of FIG. 5A. Set/reset signal generator 610 may also be used to generate an enable signal (EnF 640, which may be an example of an enable signal as described with reference to FIGS. 3A, 3B, and 4) for signal driver 620 using memory signal 635. In some cases, memory signal 635 represents multiple memory control signals.

Set/reset signal generator 610 may include logic that is configured to process the delay signals and generate the set and reset signals (which may also be referred to as input signals) for signal driver 620. In some cases, the logic combines the delay signals with other memory signals (e.g., initialization signals, row activation signals, column activation signals, etc.). Set/reset signal generator 610 may also include logic that is configured to process internal memory signals (e.g., idle signals and test signals) and generate an enable signal (EnF 640) based on the processed memory signals. In some cases, the control signal generation system 600 may be configured in a test mode or a single cell operation mode based on the processed memory signals.

Signal driver 620 may be configured to generate control signals based on the outputs of set/reset signal generator 610. For example, an output of signal driver 620 may transition to a first state (which may be represented by a high voltage) when SigSet 615 transitions to the first state. And the output of signal driver 620 may transition to a low state when SigReset 630 transitions to a high voltage. Also, signal driver 620 may enable an XOR functionality when EnF 640 is in the first state and disable an XOR functionality when EnF 640 is in the second state. Additionally, signal driver 620 may output the first state when ForceH 645 (which may be an example of a configuration signal as described with reference to FIGS. 3A, 3B, and 4) is in the first state, regardless of a state of SigSet 615, SigReset 630, and EnF 640.

Figure 7:
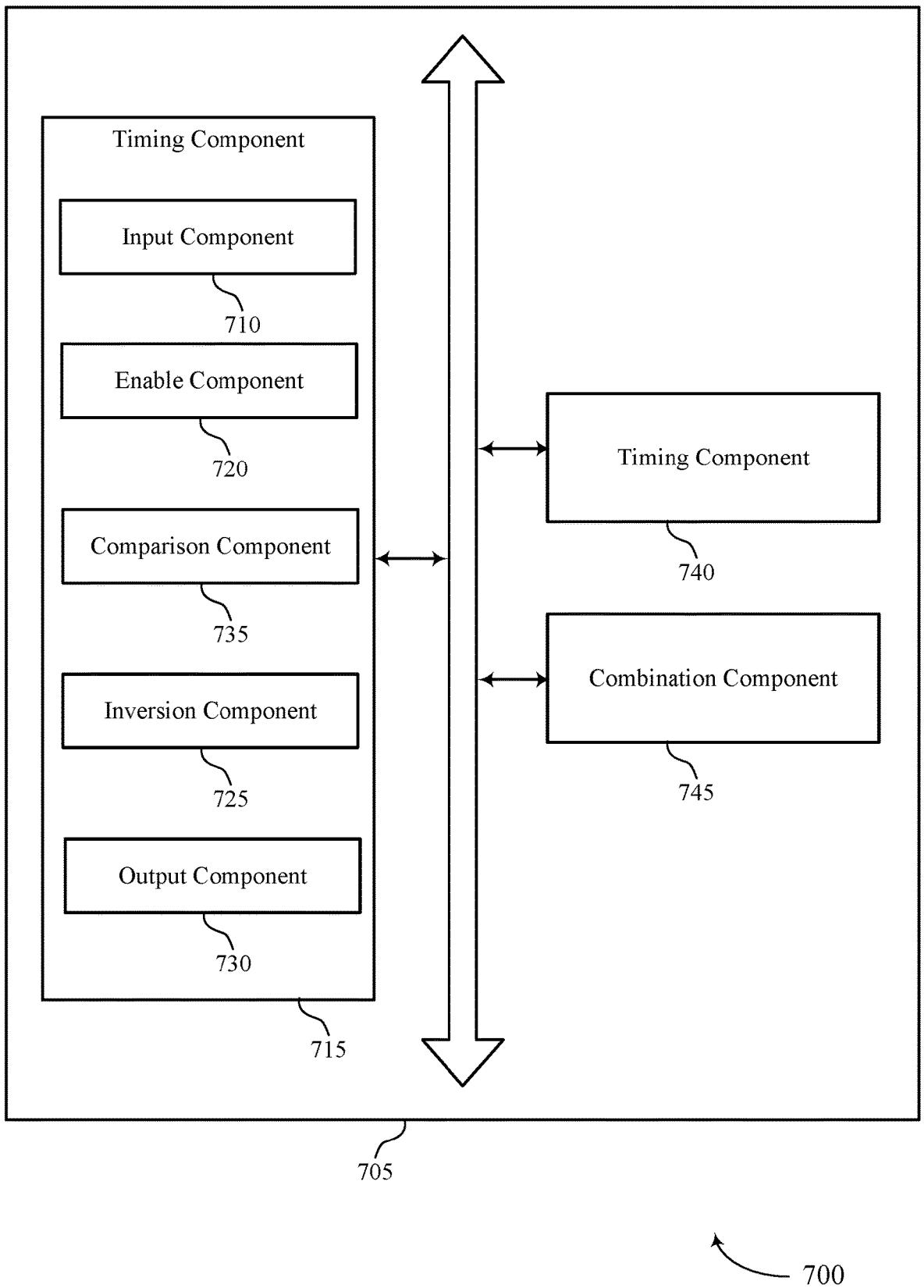
FIG. 7 illustrates a block diagram of a memory array that supports generating memory array control signals in accordance with examples as disclosed herein.

FIG. 7 illustrates a block diagram 700 of a memory controller 705 that supports generating memory array control signals in accordance with examples as disclosed herein. The memory controller 705 may be an example of aspects of a memory controller as described with reference to FIGS. 1 and 2. The memory controller 705 may include one or more timing components, including first timing component 715 and second timing component 740, and a combination component 745.

First timing component 715 may include an input component 710, an enable component 720, an inversion component 725, a comparison component 735, and an output component 730. Each of these modules may communicate, directly or indirectly, with one another (e.g., via one or more buses). In some cases, first timing component 715 and second timing component 740 may share one or more of the input component 710, comparison component 735, or the inversion component input component 725.

The input component 710 may receive a first input signal having a first delay relative to an external command received at the memory device and a second input signal having a second delay relative to the external command, the second delay being larger than the first delay.

The first timing component 715 may configure a first state for the signal based on the first input signal and the second input signal having different states. In some examples, the first timing component 715 may configure a second state for the signal based on the first input signal and the second input signal having a same state, where the signal transitions from the first state to the second state based on the first input signal and the second input signal.

In some examples, the first timing component 715 may detect (e.g., using the comparison component 735) that the first input signal and the second input signal have the different states based on the first input signal transitioning to the first state, the second input signal having the second state, and the third input signal indicating that the first timing component is enabled, where the signal is configured to have the first state based on the detecting. In some examples, the first timing component 715 may detect (e.g., using the comparison component 735) that the first input signal and the second input signal have the same state based on the first input signal having the first state, the second input signal transitioning to the first state, and the third input signal indicating that the first timing component 715 is enabled, where the signal is configured to have the second state based on the detecting.

In some examples, the first timing component 715 may detect (e.g., using the comparison component 735) that the first input signal and the second input signal have the different states based on the first input signal transitioning to the second state. The enable component 720 may maintain the second state for the signal when the first input signal and the second input signal have the different states based on the third input signal.

In some examples, the input component 710 may receive a third input signal that indicates that at least a portion of the first timing component 715 is disabled based on the signal having the second state. In some examples, the enable component 720 may override a first logic component based on the third input signal indicating that at least the portion of the timing component is disabled, where the signal is configured to have the second state based on the third input signal.

The inversion component 725 may invert the signal configured by first timing component 715. The output component 730 may output an inverted signal that is an inverted version of the signal. In some examples, the combination component 745 may combine an output of the first timing component 715 with an output of the second timing component 740 that receives a fourth input signal relative to the external command and a fifth input signal relative to the external command. In some examples, the combination component 745 may output a second signal that includes at least two pulses based on the combining.

Figure 8:
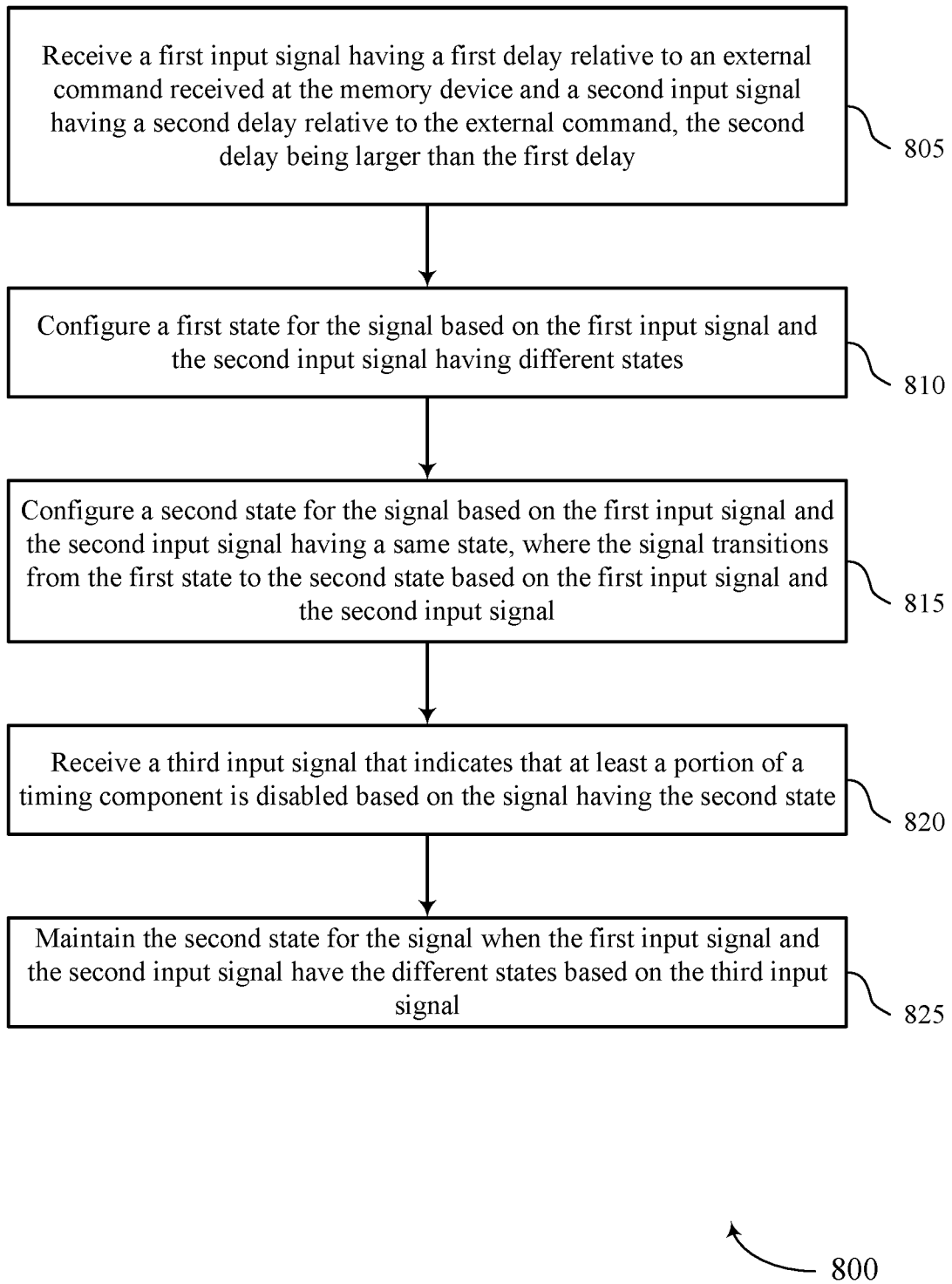
FIG. 8 illustrates a flowchart illustrating a method or methods that support generating memory array control signals in accordance with examples as disclosed herein.

FIG. 8 illustrates a flowchart illustrating a method or methods 800 that supports generating memory array control signals in accordance with examples as disclosed herein. The operations of method 800 may be implemented by a memory controller or its components as described herein. For example, the operations of method 800 may be performed by a memory controller as described with reference to FIG. 7. In some examples, a memory controller may execute a set of instructions to control the functional elements of the memory controller to perform the described functions. Additionally, or alternatively, a memory controller may perform aspects of the described functions using special-purpose hardware.

At 805, a first input signal having a first delay relative to an external command received at the memory device and a second input signal having a second delay relative to the external command may be received, where the second delay may be larger than the first delay. The operations of 805 may be performed according to the methods described herein. In some examples, aspects of the operations of 805 may be performed by an input component as described with reference to FIG. 7.

At 810, a first state may be configured for a signal based on the first input signal and the second input signal having different states. The operations of 810 may be performed according to the methods described herein. In some examples, aspects of the operations of 810 may be performed by a timing component as described with reference to FIGS. 3 through 7.

At 815, a second state may be configured for the signal based on the first input signal and the second input signal having a same state, where the signal transitions from the first state to the second state based on the first input signal and the second input signal. The operations of 815 may be performed according to the methods described herein. In some examples, aspects of the operations of 815 may be performed by a timing component (e.g., in combination with a comparison component), as described with reference to FIGS. 3 through 7.

At 820, a third input signal that indicates that at least a portion of the timing component is disabled may be received based on the signal having the second state. The operations of 820 may be performed according to the methods described herein. In some examples, aspects of the operations of 820 may be performed by a timing component (e.g., in combination with an input component), as described with reference to FIGS. 3 through 7.

At 825, the second state for the signal may be maintained when the first input signal and the second input signal have the different states based on the third input signal. The operations of 825 may be performed according to the methods described herein. In some examples, aspects of the operations of 825 may be performed by timing component (e.g., in combination with an enable component), as described with reference to FIGS. 3 through 7.

In some examples, an apparatus as described herein may perform a method or methods, such as the method 800. The apparatus may include features, means, or instructions (e.g., a non-transitory computer-readable medium storing instructions executable by a processor) for receiving a first input signal having a first delay relative to an external command received at the memory device and a second input signal having a second delay relative to the external command, the second delay being larger than the first delay; configuring a first state for a signal based on the first input signal and the second input signal having different states; configuring a second state for the signal based on the first input signal and the second input signal having a same state, where the signal transitions from the first state to the second state based on the first input signal and the second input signal; receiving a third input signal that indicates that at least a portion of the timing component is disabled based on the signal having the second state; and maintaining the second state for the signal when the first input signal and the second input signal have the different states based on the third input signal.

Some examples of the method 800 and the apparatus described herein may further include operations, features, means, or instructions for detecting that the first input signal and the second input signal may have the different states based on the first input signal transitioning to the first state, at least in part on the second input signal having the second state, and at least in part on the third input signal indicating that a timing component may be enabled, where the signal may be configured to have the first state based on the detecting, and detecting that the first input signal and the second input signal may have the same state based on the first input signal having the first state, at least in part on the second input signal transitioning to the first state, and at least in part on the third input signal indicating that the timing component may be enabled, where the signal may be configured to may have the second state based on the detecting.

Some examples of the method 800 and the apparatus described herein may further include operations, features, means, or instructions for detecting that the first input signal and the second input signal may have the different states based on the first input signal transitioning to the second state, and overriding a first logic component based on the third input signal indicating that at least the portion of the timing component may be disabled, where the signal may be configured to have the second state based on the third input signal.

Some examples of the method 800 and the apparatus described herein may further include operations, features, means, or instructions for inverting the signal, and outputting an inverted signal that may be an inverted version of the signal.

Some examples of the method 800 and the apparatus described herein may further include operations, features, means, or instructions for combining an output of a timing component with an output of another timing component that receives a fourth input signal relative to the external command and a fifth input signal relative to the external command, and outputting a second signal that includes at least two pulses based on the combining.

It should be noted that the methods described herein are possible implementations, and that the operations and the steps may be rearranged or otherwise modified and that other implementations are possible. Furthermore, portions from two or more of the methods may be combined.

An apparatus is described. The apparatus may include a timing component that is configured to generate a signal for operating a memory array, the timing component including a first logic component configured to indicate when a first input signal for the timing component and a second input signal for the timing component have different states, a second logic component coupled with the first logic component and configured to indicate when at least one of the first input signal or the second input signal have a first state, where an output of the second logic component is based on a third input signal, and a third logic component coupled with the first logic component and the second logic component, the third logic component configured to indicate when the first input signal and the second input signal have a same state, where an output of the third logic component is configured to be set to the first state based on the third input signal indicating that the first logic component is disabled.

In some examples, the timing component may include operations, features, means, or instructions for a fourth logic component coupled with the third logic component, where an output of the fourth logic component includes the signal for operating the memory array.

In some examples, the fourth logic component may include operations, features, means, or instructions for a first inverter configured to invert the output of the third logic component, where the output of the fourth logic component includes an output of the first inverter.

In some examples, the fourth logic component may include operations, features, means, or instructions for a first inverter configured to invert the output of the third logic component, and a second inverter configured to invert an output of the first inverter, where the output of the fourth logic component includes the signal for operating the memory array.

In some examples, an output of the second logic component may be configured to be set to a second state and an output of the third logic component may be configured to be set to the first state based on the third input signal indicating that the first logic component may be disabled.

In some examples, an output of the third logic component may be configured to be set to a second state based on a fourth input signal having the first state.

In some examples, the first logic component may include operations, features, or instructions for a first inverter configured to invert the first input signal to obtain a first inverted signal that may be an inverted version of the first input signal, a second inverter configured to invert the second input signal to obtain a second inverted signal that may be an inverted version of the second input signal, and a logic gate that may be configured to indicate when the first input signal and the second input signal may have the different states based on the first input signal, the second input signal, the first inverted signal, and the second inverted signal.

In some examples, the logic gate may include operations, features, means, or instructions for a first non-inverting input configured to receive the first input signal, a second non-inverting input configured to receive the second input signal, a first inverting input configured to receive the first inverted signal, and a second inverting input configured to receive the second inverted signal.

In some examples, the second logic component may include operations, features, means, or instructions for a first logic gate that may be configured to indicate when the first input signal and the second input signal may have a second state based on the first inverted signal and the second inverted signal, and a second logic gate that may be configured to invert an output of the first logic gate based on the third input signal indicating that the first logic component may be enabled and to set an output of the first logic component to the second state based on the third input signal indicating that the first logic component may be disabled.

In some examples, the second logic component may include operations, features, means, or instructions for a third inverter that may be configured to invert the third input signal and to set an output of the third logic component to the first state based on the third input signal indicating that the first logic component may be disabled.

In some examples, the third logic component may include operations, features, means, or instructions for a third logic gate that may be configured to indicate when the first input signal and the second input signal may have the different states when the third input signal indicates that the first logic component may be enabled.

In some examples, the third logic component may include operations, features, means, or instructions for a fourth logic gate that may be configured to invert an output of the third logic gate when a fourth input signal indicates that an operating mode may be configured for the memory array, where an output of the fourth logic gate may be configured to be set to the second state based on the fourth input signal indicating that a testing mode may be configured for the memory array.

In some examples, the timing component may be configured to change a state of the signal from a second state to the first state based on the first input signal and back to the second state based on the second input signal.

Some examples of the apparatus may include a second timing component that may be configured to generate signals for operating the memory array and that includes.

In some examples, an output of the seventh logic component may be configured to be set to a second state based on a seventh input signal having the first state.

An apparatus is described. The apparatus may include a memory array, a set of delay circuits configured to generate a set of delay signals based on an external command, each delay signal of the set of delay signals generated by a respective delay circuit of the set of delay circuits and having a respective delay relative to the external command, and a timing component coupled with the memory array and configured to receive a first delay signal of the set of delay signals and a second delay signal of the set of delay signals, the timing component configured to generate an output signal for operating the memory array based on the first delay signal and the second delay signal, where the timing component includes a first logic component configured to indicate when the first delay signal and the second delay signal have different states, the second delay signal having longer delay relative to the external command than the first delay signal, a second logic component coupled with the first logic component and configured to indicate when at least one of the first delay signal or the second delay signal have a first state, where an output of the second logic component is based on an enable signal for the timing component, and a third logic component coupled with the first logic component and the second logic component, the third logic component configured to indicate when the first delay signal and the second delay signal have a same state, where an output of the third logic component is configured to be set to the first state based on the enable signal indicating that the first logic component is disabled.

Some examples of the apparatus may include a memory controller configured to generate the enable signal based on the set of delay signals.

In some examples, the timing component further may include operations, features, means, or instructions for a fourth logic component coupled with the third logic component and configured to output the output signal for operating the memory array.

Some examples of the apparatus may include a second timing component coupled with the memory array, the second timing component configured to generate another output signal for operating the memory array based on a third delay signal of the set of delay signals and a fourth delay signal of the set of delay signals having different states, the third delay signal having a third delay relative to the external command and the fourth delay signal having a fourth delay relative to the external command.

Some examples of the apparatus may include a fourth logic component configured to combine the output signal generated by the timing component and the other output signal generated by the second timing component, where a resulting output signal includes at least two pulses.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

As used herein, the term "substantially" means that the modified characteristic (e.g., a verb or adjective modified by the term substantially) need not be absolute but is close enough to achieve the advantages of the characteristic.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise random-access memory (RAM), read-only memory (ROM), electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
a signal driver comprising:
a first driver comprising combinational logic configured to obtain a first control signal based at least in part on a first delay signal and a second delay signal, wherein first logic of the combinational logic is configured to indicate when the first delay signal and the second delay signal have different states, second logic of the combinational logic is configured to indicate when at least one of the first delay signal or the second delay signal have a first state, and third logic of the combinational logic is configured to indicate when the first delay signal and the second delay signal have a same state;
a second driver configured to obtain a second control signal based at least in part on a third delay signal and a fourth delay signal; and
output logic coupled with the first driver and the second driver and configured to combine the first control signal and the second control signal to obtain a signal for operating a memory array.

2. The apparatus of claim 1, wherein the output logic comprises:
an AND gate coupled with an output of the first driver, and
an inverter coupled with the AND gate and an output of the second driver.

3. The apparatus of claim 2, wherein the output logic further comprises:
an inverted OR gate that is coupled with an output of the AND gate, and
an input that is coupled with the inverted OR gate, the input configured to receive a signal for indicating whether the memory array is configured in an operating mode or a testing mode.

4. The apparatus of claim 3, further comprising:
a second inverter coupled with an output of the inverted OR gate and configured to generate the signal for operating the memory array.

5. The apparatus of claim 1, wherein:
fourth logic of the combinational logic is configured to invert an output of the third logic of the combinational logic, wherein the fourth logic of the combinational logic is further configured to generate the first control signal.

6. The apparatus of claim 1, wherein:
an output of the second logic of the combinational logic is based at least in part on a signal for overriding an output of the first logic of the combinational logic; and the third logic of the combinational logic is configured to set the first control signal to the first state based at least in part on the signal being configured to override the output of the first logic of the combinational logic.

7. The apparatus of claim 1, wherein:
an output of the second logic of the combinational logic is configured to be set to a second state based at least in part on a signal indicating that the first logic of the combinational logic is disabled.

8. The apparatus of claim 1, wherein:
the second driver comprises second combinational logic,
first logic of the second combinational logic is configured to indicate when the third delay signal and the fourth delay signal have different states,
second logic of the second combinational logic is configured to indicate when at least one of the third delay signal or the fourth delay signal have the first state, wherein an output of the second logic of the second combinational logic is configured to be set to a second state based at least in part on a signal indicating that the first logic of the second combinational logic is disabled, and
third logic of the second combinational logic is configured to indicate when the third delay signal and the fourth delay signal have a same state, wherein the third logic of the second combinational logic is configured to set the second control signal to the first state based at least in part on the signal indicating that the first logic of the second combinational logic is disabled.

9. An apparatus, comprising:
first logic, wherein a first input of the first logic is coupled with an exclusive OR gate of the first logic and a first inverter of the first logic, and wherein a second input of the first logic is coupled with the exclusive OR gate of the first logic and a second inverter of the first logic;
second logic, wherein a first input of the second logic is coupled with an AND gate of the second logic, wherein a second input of the second logic is coupled with the AND gate of the second logic, and wherein a third input of the second logic is coupled with an inverter of the second logic and an inverted OR gate of the second logic; and
third logic, wherein a first input of the third logic is coupled with an AND gate of the third logic and the exclusive OR gate of the first logic, wherein a second input of the third logic is coupled with the AND gate of the third logic and the inverted OR gate of the second logic, and wherein a third input of the third logic is coupled with the AND gate of the third logic and the inverter of the second logic.

10. The apparatus of claim 9, wherein:
a first input of the exclusive OR gate of the first logic is coupled with the first input of the first logic,
a second input of the exclusive OR gate of the first logic is coupled with an output of the first inverter of the first logic,
a third input of the exclusive OR gate of the first logic is coupled with the second input of the first logic, and
a fourth input of the exclusive OR gate of the first logic is coupled with an output of the second inverter of the first logic.

11. The apparatus of claim 10, wherein:
the second input of the exclusive OR gate of the first logic is coupled, via the first input of the second logic, with a first input of the AND gate of the second logic, and the fourth input of the exclusive OR gate of the first logic is coupled, via the second input of the second logic, with a second input of the AND gate of the second logic.

12. The apparatus of claim 9, wherein:
a first input of the inverted OR gate of the second logic is coupled with an output of the AND gate of the second logic,
a second input of the inverted OR gate of the second logic is coupled with the third input of the second logic and the inverter of the second logic, and
the third input of the second logic is configured to receive a signal for overriding an output of the first logic.

13. The apparatus of claim 9, wherein:
a first input of the AND gate of the third logic is coupled with an output of the exclusive OR gate of the first logic,
a second input of the AND gate of the third logic is coupled with an output of the inverted OR gate of the second logic, and
a third input of the AND gate of the third logic is coupled with an output of the inverter of the second logic.

14. The apparatus of claim 9, wherein an inverted OR gate of the third logic is coupled with the AND gate of the third logic.

15. The apparatus of claim 14, wherein:
a first input of the inverted OR gate of the third logic is coupled with an output of the AND gate of the third logic, and
a second input of the inverted OR gate of the third logic is coupled with a fourth input of the third logic configured to receive a signal for configuring a memory array in an operating mode or a testing mode.

16. The apparatus of claim 9, further comprising:
fourth logic, wherein a first input of the fourth logic is coupled with the inverted OR gate of the third logic and an inverter of the fourth logic.

17. An apparatus, comprising:
a first driver comprising first combinational logic configured to generate a first signal for operating a memory array based at least in part on a first delay signal and a second delay signal, wherein first logic of the first combinational logic is configured to indicate when the first delay signal and the second delay signal have different states, second logic of the first combinational logic is configured to indicate when at least one of the first delay signal or the second delay signal have a first state, and third logic of the first combinational logic is configured to indicate when the first delay signal and the second delay signal have a same state;
a second driver comprising second combinational logic configured to generate a second signal for operating the memory array based at least in part on a third delay signal and a fourth delay signal; and
a composite driver configured to generate a third signal for operating the memory array based at least in part on a fifth delay signal and a sixth delay signal, the composite driver including a third driver comprising third combinational logic that has a same configuration as the first combinational logic and a fourth driver comprising fourth combinational logic that has a same configuration as the second combinational logic.

18. The apparatus of claim 17, wherein:
first logic of the second combinational logic is configured to indicate when the third delay signal and the fourth delay signal have different states, second logic of the second combinational logic is configured to indicate when at least one of the third delay signal or the fourth delay signal have the first state, and third logic of the second combinational logic is configured to indicate when the third delay signal and the fourth delay signal have a same state.

19. The apparatus of claim 17, wherein:

the first signal for operating the memory array comprises a first voltage pulse of a first length during a first time period, the second signal for operating the memory array comprises a second voltage pulse of a second length during the first time period, the second length being smaller than the first length, and the third signal for operating the memory array comprises a third voltage pulse and a fourth voltage pulse during the first time period.

20. The apparatus of claim 17, wherein:

the first signal for operating the memory array is for activating a word line for a memory operation, the second signal for operating the memory array is for activating a sense component for the memory operation, and the third signal for operating the memory array is for accessing a memory cell a plurality of times during the memory operation.

* * * * *